United States Patent [19]
Lekmine et al.

[11] Patent Number: 5,298,901
[45] Date of Patent: Mar. 29, 1994

[54] DIGITAL DECODING USING DYNAMICALLY DETERMINED TRACKING THRESHOLD VALUES

[75] Inventors: Brahim Lekmine, Denver; Donald L. Millican, Westminster; Joe K. Jurneke, Brighton; Douglas A. Gunther, Lakewood, all of Colo.

[73] Assignee: Storage Technology Corporation, Louisville, Colo.

[21] Appl. No.: 834,648

[22] Filed: Feb. 12, 1992

[51] Int. Cl.⁵ .......................... H03M 1/12; H03M 1/06
[52] U.S. Cl. ........................................ 341/155; 341/118
[58] Field of Search ................... 341/155, 118; 371/43, 371/44

[56] References Cited
U.S. PATENT DOCUMENTS
4,945,538 7/1990 Patel ........................................ 371/43

Primary Examiner—Sharon D. Logan
Attorney, Agent, or Firm—Sheridan Ross & McIntosh

[57] ABSTRACT

A data channel is provided that includes a digital decoder that receives a dynamically determined tracking threshold value. The tracking threshold value has a voltage amplitude used by the decoder in decoding a digital voltage signal into binary data. The digital signal is generated using an analog voltage signal that represents data read from a storage medium, such as a magnetic tape or disk. The present method is able to generate appropriate tracking threshold values even during sudden changes in the voltage amplitudes associated with the digital signal. In dynamically determining tracking threshold values, an averaging method with error recovery is employed, that is independent of the particular encoding used with the stored data. For each inputted digital voltage signal that represents a binary bit, a comparison is made between it and a current accepting value. Unless the digital voltage signal is at least equal to the accepting value, it is not used in computing a new tracking threshold value. A running average value, based on a predetermined number of the most recently accepted digital voltage signal amplitudes, is determined. An updated tracking threshold value is then determined from the current average value. A feedback loop is also utilized whereby an updated accepting value is determined to be used in accepting-/rejecting further signal inputs. The error recovery is employed to decrease the accepting value if a predetermined number of consecutively received digital voltage signals are rejected.

33 Claims, 2 Drawing Sheets

DIGITAL DECODING USING DYNAMICALLY DETERMINED TRACKING THRESHOLD VALUES

FIELD OF THE INVENTION

This invention relates to digital decoding of data stored on a medium and, in particular, to updating a tracking threshold value based on changing values associated with an inputted digital signal.

BACKGROUND OF THE INVENTION

For data storage devices that store encoded data, an apparatus is commonly provided for decoding the analog output or readback signal from the device to its digital representation. In one well known analog signal technique, analog signal amplitudes are utilized. Specifically, relatively large signal or voltage amplitudes, either positive or negative, represent a binary "1" while relatively smaller amplitudes represent a binary "0".

To convert these analog signals accurately into their corresponding binary or digital representation, at least one threshold value is provided and compared with the current signal amplitude. Based on the comparison, amplitudes above the threshold value are converted to a binary "1" and those below to a binary "0". Further, because of storage media variations that might arise during their manufacture, the analog readback signal can be such that, unless this threshold is varied, an accurate determination of whether a binary "1" or "0" is present cannot be made. Because of analog signal amplitude changes due to media defects or other reasons, the threshold value should be readily adaptable to change whenever there is a decreasing of the amplitudes known as signal "drop-out" or an increasing of the amplitudes known as signal "drop-in".

In one known digital technique for taking into account the fact that the analog readback signal amplitudes might appreciably change, reference values associated with an analog to digital converter (ADC) are varied. These reference values are applied to the numerous comparators found in the ADC. Depending upon the reference values, for a particular analog input, the ADC binary output may vary. For example, if signal drop-out occurs, the reference values would decrease thereby dynamically adjusting the ADC so that the digital output more accurately reflects the analog readback signal. However, this solution requires more hardware and is therefore expensive to implement.

In another digital technique that compensates for varying inputted analog signal amplitudes, threshold values associated with an inputted digital signal are varied. More specifically, in U.S. Pat. No. 4,945,538 to Patel, issued Jul. 31, 1990, and entitled "Method and Apparatus For Processing Sample Values In A Coded Signal Processing Channel", a decoder is disclosed that receives dynamically adjustable threshold values. The decoder relies on a state dependent look ahead technique to determine the most likely binary value to output and supplies an error correction capability if a previous decision is suspected to be incorrect. The threshold values used by the decoder can be continuously adjusted to fit the current digital samples. However, the decoder, including the equations and data tables upon which it is based, in determining the threshold values requires a fixed predetermined run length limited data format, in particular the (1,7) format. If the encoded data is in a different run length code format, the disclosed equations and data tables are not applicable.

From the foregoing it can be seen that there is a need for a less complex, relatively inexpensive apparatus for supplying such decoders with dynamically adjustable threshold values in which drop-in and drop-out of the analog signal can be handled properly. It would also be advantageous if such an apparatus for generating threshold values were not dependent on any specific data encoding format such as the run length limited encoding (1,7).

SUMMARY OF THE INVENTION

The present invention relates to method and apparatus for decoding analog signals into binary data. The present invention obtains accurate binary data even during periods of rapid signal drop-in and/or drop-out using a dynamically determined tracking threshold value. The invention includes a data channel in which an analog readback signal is converted to a digital voltage signal, prequalified, and decoded into binary data. The tracking threshold value is used by a digital decoder in determining whether an inputted prequalified digital voltage signal corresponds to a binary one or a binary zero.

More particularly, the analog voltage signal is initially filtered through a full wave rectifier to reduce signal noise. The signal outputted from the rectifier is then converted to a digital signal using an analog to digital converter (ADC). The ADC samples the analog signal at regular intervals and outputs a sequence of digital voltage values. The digital voltage values are then inputted into a prequalifier which averages a predetermined number of such voltage values. This average value, to be denoted as a digital input, corresponds to the binary bit to be decoded. Each of these digital inputs is, preferably, a digital voltage signal, which is inputted into a digital decoder, preferably a Viterbi decoder, for determining the binary state of the inputted signal. The Viterbi decoder uses a voltage tracking threshold value in determining the binary state of the inputted digital voltage signals, i.e. whether each such voltage signal is representative of a binary "1" or a binary "0". The tracking threshold values are dynamically determined to track or follow the fluctuations in the inputted digital voltage signals. Thus, for each digital voltage signal to be decoded, there is potentially an updated or different tracking threshold value.

In connection with determining the tracking threshold value, the prequalifier supplies a tracking threshold module with the digital voltage signal. Specifically, each digital voltage signal is inputted to a comparator of the tracking threshold module. The comparator determines whether the amplitude of the inputted digital voltage signal is too low to be used in computing a new tracking threshold value. That is, a comparison is made to determine whether or not the current input digital voltage signal amplitude is less than an "accepting value." If so, the input voltage signal is not used in computing an updated tracking threshold value. If the input is greater than or equal to the accepting value, however, the input is accepted and an updated tracking threshold value is computed using this input. With regard to this computation, the accepted input is combined with a predetermined number of previously accepted inputs, to yield N input values in total. That is, the current accepted input value is received in a running sum circuit which computes the sum of the amplitudes of the N most recently accepted digital inputs. The sum is then used to compute the average of these N values using an averager. This average value, also denoted the reference value, is used as a basis for determining both an updated tracking threshold value and for determining an updated accepting value.

The updated accepting value is the result of the reference value being multiplied by an accepting value reduction factor (AVR), and the updated tracking threshold value is the result of the reference value being multiplied by a tracking threshold value reduction factor (TTR). For example, if TTR=90% and AVT=50%, then the updated tracking threshold value is 90% of the current reference value while the new accepting value is 50% of the current reference value. In the preferred embodiment, an accepting value modifier circuit computes the accepting value from the reference value and a tracking threshold modifier circuit computes the tracking threshold value from the current reference value.

In adjusting the tracking threshold value, such adjustment is implemented to handle signal drop-in and signal drop-out, which relate to amplitude changes in the inputted signal. In the case of drop-in of signal amplitudes, modifying the accepting value using the currently determined reference value has been found to be satisfactory. For example, since any digital signal amplitude greater than the accepting value is used (i.e. accepted), if either a gradual increase or a sudden drop-in occurs, then the updated tracking threshold values will reflect increases in the amplitudes of the digital voltage signals immediately. Similarly, if there is a gradual decrease or drop-out of signal amplitudes, then sufficient digital inputs will still be found to be acceptable for averaging. This result occurs because the AVR is set to a percentage that permits the largest of the gradually diminishing digital voltage signal amplitudes, to be accepted while still rejecting, for averaging purposes, those relatively low signal amplitudes that should not be taken into account in determining the reference value that is, in turn, used in determining the tracking threshold value.

For sudden siqnal drop-outs, however, where a long sequence of digital voltage signals could be rejected, a feedback loop is utilized for relatively rapidly lowering the accepting value. Specifically, the number of consecutively rejected digital inputs is monitored in an error recovery unit, which is part of the feedback loop. Once this number becomes greater than a predetermined number, K, a control signal is outputted by the error recovery unit to reduce the accepting value being outputted by the accepting value modifier circuit. In the preferred embodiment, the amount of the reduction equals the AVR percentage which is used when the accepting value is computed from the current average or reference value. The control signal is a function of the number of consecutive digital voltage signals that have been inputted to the tracking threshold module and which have not been accepted for averaging. This number is counted using a synchronized clock signal inputted to the error recovery unit. The clock is synchronized to the digital voltage signals, each voltage signal representing a bit cell or a binary bit. Whenever more than K consecutive digital signals are rejected by the comparator, the error recovery unit generates the control signal, which is used to reduce the accepting value. When a digital voltage signal is accepted, however, a comparator outputs a signal to a clock enabler. The clock enabler applies a pulse to the error recovery unit resetting the counter. Consequently, so long as a digital voltage signal is accepted before the count K is reached, no control signal is outputted by the error recovery unit and there is no lowering of the AVR percentage.

In view of the foregoing, a number of salient features of the present invention are readily discerned. A digital decoder is disclosed in which a tracking threshold value varies, depending upon the digital voltage signal amplitudes of the digital data being decoded. This capability enables the digital decoder to appropriately respond to digital signal changes and still output accurately decoded binary data. The adjustment of the tracking threshold value has particular utility in the case of signal drop-outs and signal drop-ins, where the voltage amplitudes of the inputted digital voltage signals gradually or rapidly change but it is still necessary to provide accurate binary data. The implementation of the varying of the tracking threshold value is less complex and less expensive than varying reference values associated with a digital to analog converter. Furthermore, the determination of the tracking threshold value, in accordance with the present invention, is independent of any encoding scheme that is associated with the stored data. The determination of the tracking threshold value also preferably includes error recovery capability that contributes to the varying of the tracking threshold value, which is particularly useful whenever there is relatively rapid signal drop-out.

Additional advantages of the present invention will become readily apparent from the following discussion, particularly when taken together with the accompanying drawings.

DETAILED DESCRIPTION

Figure 1:
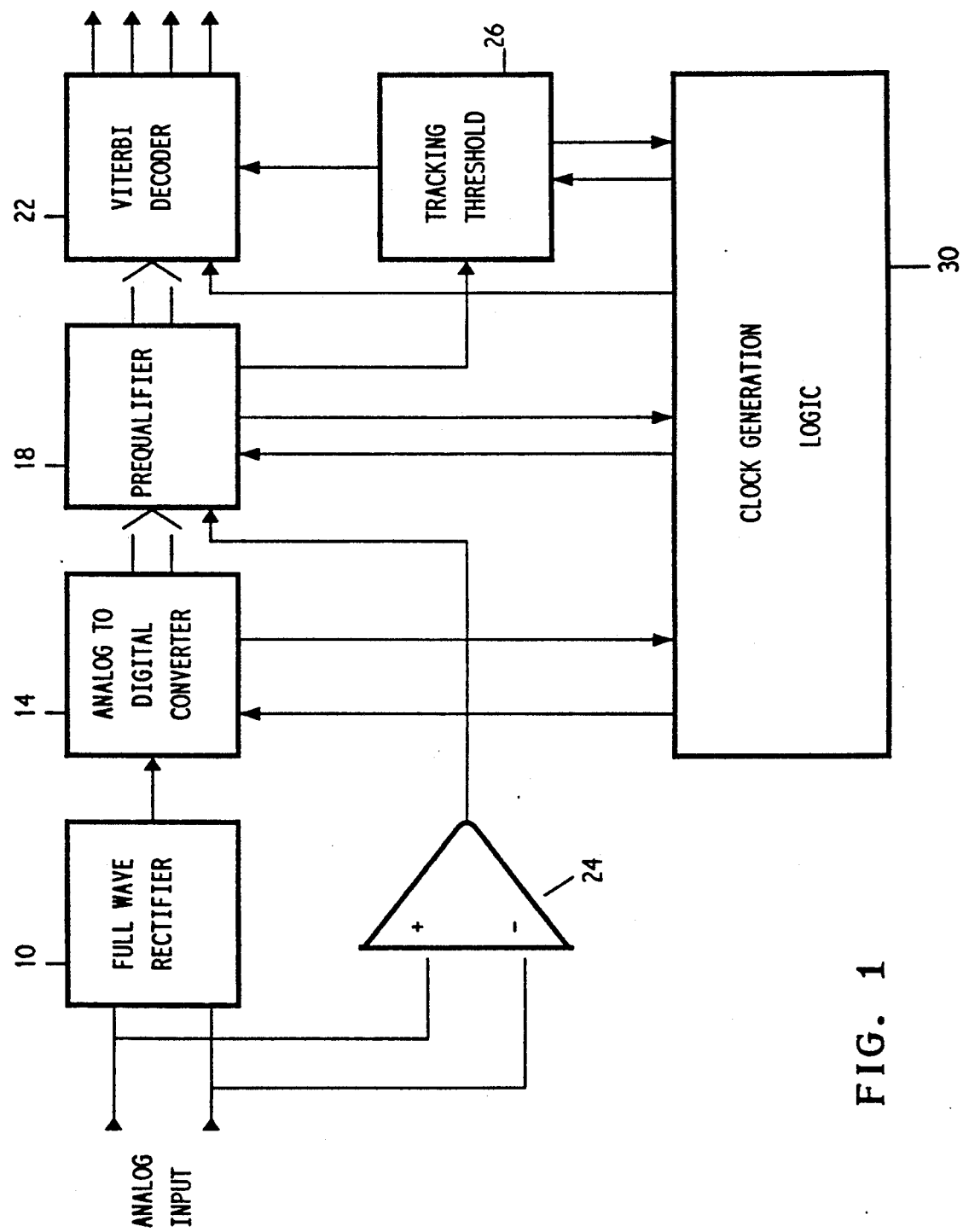
FIG. 1 is a block diagram of the data channel of the present invention including a tracking threshold module and digital decoder.

In accordance with the present invention, FIG. 1 illustrates a block diagram of the apparatus in a preferred embodiment. An analog signal is inputted from a storage medium, such as a disk or tape drive, to a full wave rectifier circuit 10 via two input connections. These two input connections provide the same analog signal to the full wave rectifier circuit 10. However, the two voltage signals are 180° out-of-phase. This allows the full wave rectifier circuit 10 to provide common mode rejection, which is well known in the art and is a means of filtering noise by use of these differential signals. The output of the rectifier circuit 10 serves as the input to an analog to digital converter (ADC) 14. The ADC 14 receives this input via an electrical connection with the rectifier 10. The ADC 14 converts the inputted analog signal into a series digital voltage values representative of the inputted analog signal. The digital signal from the ADC 14 is applied to a prequalifier circuit 18 for providing an "averaged" digital signal output. Specifically, a predetermined sequential number of pulses of the digital waveform are averaged and a digital voltage signal representing this average is outputted by the prequalifier circuit 18. In one embodiment, four digital samples are averaged to provide digital input, preferably a digital voltage signal. The four digital samples can be conceptualized as a bit cell, with one bit cell corresponding to one digital bit. In conjunction with the averaging function, the prequalifier circuit 18 also receives a signal representative of the sign or polarity of the data signal generated from the storage medium. This sign related signal is generated by a sign determining circuit 24 and the output thereof is in electrical communication with the prequalifier circuit 18. The prequalifier circuit 18 therefore outputs a properly signed average of each of four digital samples corresponding to a single digital bit. The digital voltage signals comprising these average values is supplied to digital decoder 22, preferably a Viterbi decoder, via the electrical connection between the prequalifier circuit 18 and the decoder 22. Basically, the Viterbi decoder 22 takes the digitized average voltage signals outputted from the prequalifier circuit 18 and determines the binary state associated with these voltage signals. Each digital voltage signal inputted to the Viterbi decoder 22 is determined to be a binary "0" or a binary "1". Briefly the Viterbi decoder 22 relies on a number of digital voltage signals in determining the binary state of a current bit cell. A Viterbi decoder that is applicable for use with the present invention is disclosed in U.S. patent application Ser. No. 728,719, filed Jul. 11, 1991, entitled "Modified Vitebi Detector With Run-Length Code Constraint" and assigned to the same assignee as the present invention. The decoder 22 also requires a threshold voltage value as a reference in order to determine if a bit cell corresponds to a binary "1" or a binary "0." This threshold value, known as the "tracking threshold value" and denoted $V_{tt}$, is a positive value computed dynamically by the tracking threshold circuit or module 26 and applied as an input to the Viterbi decoder 22, as indicated in FIG. 1. In dynamically computing the tracking threshold, the circuit 26 also receives the digital voltage signals from prequalifier circuit 18 via the connection with these circuits. Note that for the above mentioned circuits or modules 10-26 to process the analog input properly this input must be accurately sampled and the operations of the modules 10-26 must be synchronized. This is facilitated by the timing pulses supplied via the connections between the clock generation logic circuit or module 30 and the modules 14-26.

Figure 2:
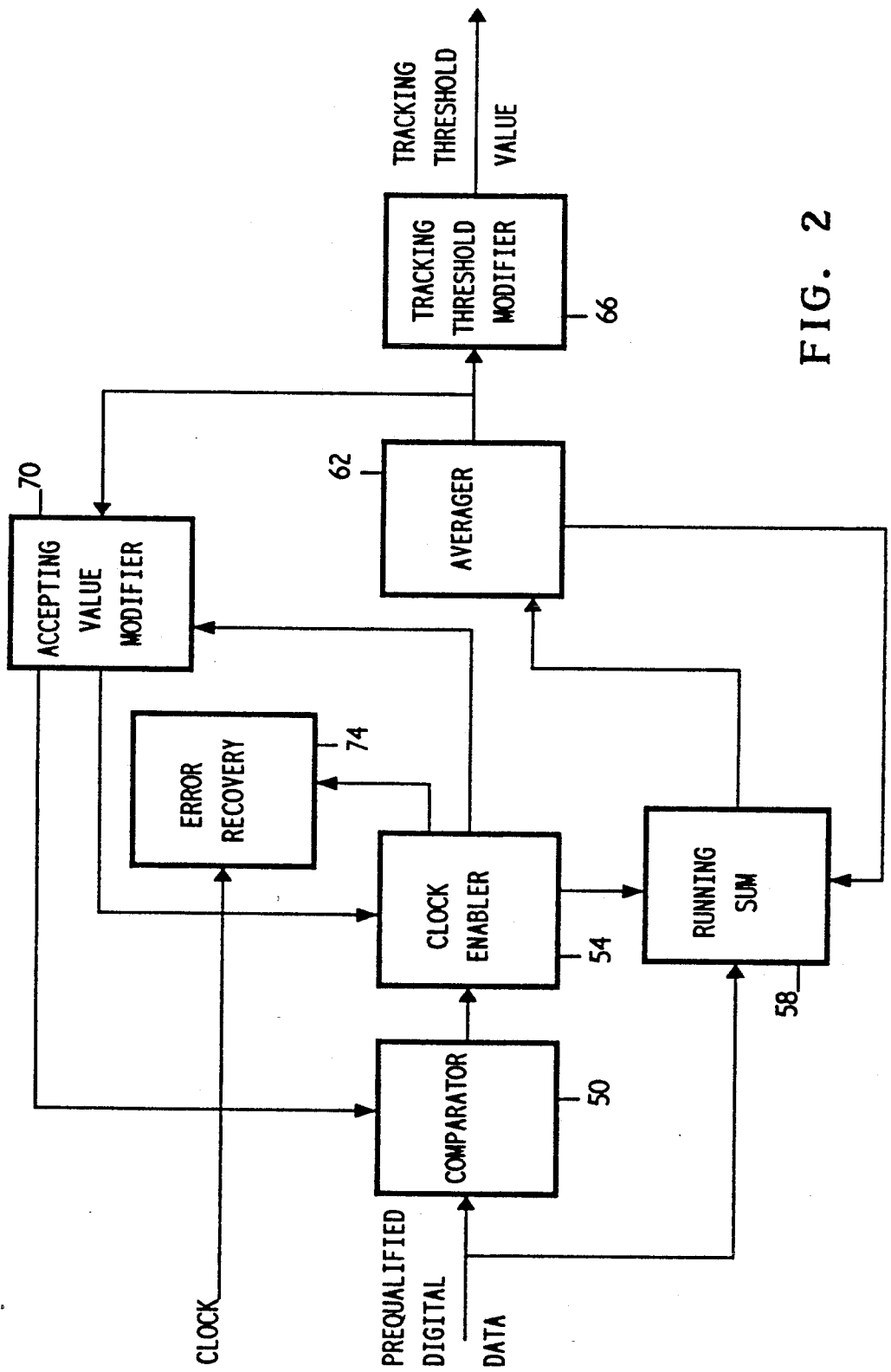
FIG. 2 is a block diagram illustrating in greater detail the tracking threshold module.

In FIG. 2 a more detailed functional block diagram of the tracking threshold module 26 is illustrated. The tracking threshold module 26 receives the prequalified data from the prequalifier 18. More specifically, the output of the prequalifier 18 is sent to a comparator 50. The comparator 50 compares each of the digital voltage signals or prequalified data with an accepting value. The output of the comparator 50 is sent to a clock enabler 54, which outputs enabling pulses to other units or circuits in the tracking threshold module 26. One of the circuits that receives pulses from the clock enabler 54 is a running sum circuit 58. The running sum circuit 58 also receives as an input the prequalified data from the prequalifier 18. The running sum circuit 58 computes and outputs a running sum total of the amplitudes of certain digital voltage signals. In particular, the predetermined number, N, of "accepted" digital voltage signals are used in determining the current sum. In one embodiment, the running sum circuit 58 includes a N bit shift register. When a newly accepted value is to be input, due to an enabling pulse from the clock enabler 54, each of the current N values are shifted into the next bit position in the shift register with the bit in the last bit position being replaced or shifted out by the bit in the next-to-last bit position. The output of the running sum circuit is applied to an averager 62. The averager 62 averages the output of the running sum circuit 58. Specifically, the averager 62 divides the output of the running sum circuit 58 by the number N of retained accepted digital voltage amplitudes that form the running sum outputted by the running sum circuit 58. It should be noted that, in the preferred embodiment, N is a power of two, e.g. 4; this simplifies the hardware division circuitry of the averager since a shift register is sufficient for division by powers or two. The output of the averager 62 is therefore the output of the running sum circuit 58 divided by the predetermined number N. The running sum circuit 58 and the averager 62 function to output a digital amplitude value that represents a magnitude relating the larger amplitudes of the digital voltage signals to an accurate tracking threshold value for the bit cell currently being input into the decoder. The output of the averager 62, denoted the reference value, is sent to a tracking threshold modifier 66. The tracking threshold modifier 66 reduces the reference value by a predetermined percentage. The output of the tracking threshold modifier is inputted to the Viterbi decoder 22 and is used by the algorithms or metrics associated with the Viterbi decoder in determining the binary state of each bit cell, which is also inputted to the Viterbi decoder 22 by the prequalifier 18.

The output of the averager 62 is also transmitted to an accepting value modifier circuit 70. The modifier 70 also modifies or reduces the reference value by a predetermined percentage. The magnitude of the percentage that is multiplied by the reference value is typically less than the percentage factor that is multiplied by the reference value in the tracking threshold modifier 66. The predetermined percentages used by the tracking threshold modifier 66 and the accepting value modifier 70 can be predesignated by a user, defaulted to pre-established system values or adaptively modified during signal decoding. The output of the accepting value modifier 70 is the accepting value that is used by the comparator 50 to determine whether or not the current digital voltage signal amplitude is less than the accepting value. In addition to the accepting value being outputted by the accepting value modifier 70, this circuit also outputs an initiating or trigger signal to the clock enabler 54, which is used by the clock enabler 54 in enabling or controlling other circuits of the tracking threshold module 26.

The tracking module 26 also includes an error recovery circuit 74. One input to the error recovery 74 is a clock signal from the clock generation logic 30. The error recovery 74 includes a counter for counting clock pulses that are used in monitoring the current number of consecutively received non-accepted digital voltage signals. If a predetermined number K of clock pulses is counted by the error recovery circuit 74, corresponding to a K number of these signals that have not been accepted, the error recovery circuit 74 generates a control signal. The control signal is applied to the accepting value modifier 70 and the control signal causes the percentage associated with this circuit to be further reduced by a predetermined amount or percentage. In the case in which digital voltage signal is accepted and so indicated by a pulse from the comparator 50 to the clock enabler 54, the clock enabler 54 outputs a pulse or signal to the error recovery 74, thus, causing the resetting of the counter in the error recovery 74. Accordingly, the error recovery 74 is able to effectively monitor, and relatively rapidly reduce the magnitude of the accepting value. Thus, error recovery 74 is particularly useful during signal drop-out.

Referring back to the comparator 50, the operation of the tracking threshold module 26 will be described in greater detail. Each bit cell, which is represented by a digital voltage signal, is simultaneously inputted to both the comparator 50 and the running sum circuit 58. In the comparator 50, a comparison is made between the digital voltage signal inputted by the prequalifier 18 and the current (or initial) accepting value, which is outputted by the accepting value modifier circuit 74. If the prequalified input into comparator 50 has an amplitude that is greater than or equal to the accepting value, then the input is found to be acceptable. Once an input is accepted, a pulse is sent to the clock enabler 54 to synchronize all further processing for the accepted value. Specifically, the clock enabler 54 synchronizes the functions performed by the running sum circuit 58 so that a running sum of the most recently accepted N input values is maintained. In addition, the clock enabler 54 sends a reset signal or pulse to the error recovery 74. The running sum 58 then computes a new running sum from these values by replacing the oldest digital voltage signal amplitude with the newly accepted value. The updated sum is then supplied to the averager circuit 62. The averager 62 divides the input sum by N to obtain the average or current reference value of the most recently accepted prequalified inputs. The reference value is inputted to the tracking threshold modifier circuit 66 and the accepting value modifier circuit 70. Both circuits 66, 70 reduce the value of their input by a predetermined amount. The result of the reduction of the average output signal in the modifier circuit 66 is an updated value of the tracking threshold ($V_{tt}$). The updated $V_{tt}$ is outputted to the Viterbi decoder 22. The result of the reduction of the reference value by the accepting value modifier 70, when pulsed by the clock enabler 54, is an updated accepting value used in comparing with subsequent prequalified digital voltage values inputted to the comparator 50.

As described, a prequalified value will only be accepted for computing an updated value of $V_{tt}$ and an updated accepting value if the prequalified input amplitude is equal to or greater than the current accepting value. Accordingly, the accepting value and $V_{tt}$ can be incrementally increased indefinitely and relatively quickly if sufficiently large digital voltage signals corresponding to bit cells are inputted to the comparator 50.

Conversely, in the event of a relatively rapid signal drop-out, the tracking threshold value reduction should also be timely so that the tracking threshold module 26 is properly responsive to decreasing digital inputs. V reduction is accomplished using the error recovery circuit 74, including inputs from the clock generation logic 30 and the clock enabler 54. As previously discussed, clock pulses synchronized with the inputted digital voltage signals are counted when such digital signals are not accepted using the comparator 50. On the other hand, the clock enabler 54 outputs a pulse resetting the counter of the error recovery 74 whenever an input is accepted using the comparator 50. When the counter exceeds the predetermined value K, the error recovery 70 sends a control signal or pulse to the accepting value modifier 70 and the counter is also reset to zero. In response to the control signal, the modifier circuit 70 computes a lower accepting value by reducing the current accepting value by the same percentage as is used in reducing the reference value received from the averager 62. Then, upon receiving a synchronization pulse from the clock enabler 54, the accepting value modifier 70 sends the updated accepting value to the comparator 50 for use in subsequent comparisons. In this manner, a feedback loop is established that causes the accepting value to be lowered quickly if K is chosen properly thereby allowing lower values to be used in calculating $V_{tt}$.

Once the accepting value has been reduced, if still no input value is accepted by the comparator 50 after the predetermined number of comparisons K, the error recovery 74 once again causes the accepting value modifier 70 to reduce the accepting value by the aforesaid percentage. This process can repeat itself until the accepting value becomes essentially zero if a drop-out were sufficiently pronounced.

As an example of the operation of the threshold tracking module 26, assume a prequalified digital voltage signal of −1.60 is computed. If the accepting value is 1.00, then the amplitude of the input, 1.60, is accepted for further processing. The comparator 50 then pulses the clock enabler 54 to synchronize all further actions. The clock enabler 54 sends a pulse to the running sum 58. In response, the running sum 58 accepts the input value, 1.60. Assuming the running sum 58 contains the previously accepted values: 0.40, 0.80, 1.20, 1.40 (from oldest to newest, and N=4), then after reading the new input value, the new sequence of the N most recently accepted input values is: 0.80, 1.20, 1.40, 1.60. Using these values, the sum becomes 5.00 and the averager 62 computes the value 1.25. The new reference value is then supplied to both the tracking threshold modifier circuit 66 and the accepting value modifier circuit 70. If the threshold reduction percentage is 90%, then the new $V_{tt}$ is approximately 1.13 (i.e. 90% of 1.25). If the accepting value reduction percentage is 50%, then the new accepting value is approximately 0.63 (i.e. 50% of 1.25).

If the succeeding input values immediately after 1.6 are as low as possible and still accepted, i.e. 0.63 (yielding an accepting value of 0.61 and $V_{tt}$ of approximately 1.09), 0.61 (yielding an accepting value of approximately 0.53 and $V_{tt}$ of approximately 0.95), and 0.53 (yielding an accepting value of approximately 0.42 and $V_{tt}$ of approximately 0.76), then there is only a gradual reduction of both the accepting value (from 0.63 to 0.42) and $V_{tt}$ (from 1.13 to 0.76). If a sudden drop-out should occur, however, where the input values drop below the accepting value for an extended number of inputted digital voltage values, then the error recovery 74 will cause the accepting value and $V_{tt}$ to be reduced correspondingly. For example, if the subsequent values following the above values are: 0.4, 0.35, 0.31, 0.3, 0.25, 0.22, 0.21, 0.19, 0.22, 0.18, 0.17, 0.20, 0.16, then assuming K=3, the resulting accepting value becomes approximately 0.11 and $V_{tt}$ becomes approximately 0.19.

In the discussion above four tracking threshold parameters were noted, namely: N (the number of accepted digital voltage signals used in determining the average or reference value); K (the number of successive unaccepted digital voltage signals counted before further reducing the accepting value); AVR (the accepting value reduction factor; i.e., the amount or percentage for reducing the reference value to determine the accepting value); and TTR (the amount or percentage to determine the tracking threshold value). The magnitudes assigned to these parameters are important in achieving the objectives of the tracking threshold module 26 and to the performance of the data channel in general.

The value of N has been determined to essentially be a function of the rate of transition into a drop-out mode (decay time) and the rate of transition out of a drop-out mode (attack time). It should be noted that these factors are characteristics associated with the medium itself, such as the process involved in making the tape medium. A larger magnitude of N generally means the less responsive the tracking threshold module 26 is to attack and decay. Conversely, a smaller N generally means the module 26 is more responsive to attack and decay. Based on the testing of various vendors' magnetic tape products, it has been determined that N should be in the range of approximately 2 to 8. For simplicity of design, N has been chosen to be a power of 2. This allows division by N, in producing the reference value, to be accomplished by a relatively simple register shift rather than the sophistication required by a more general division capability.

The magnitude of K has been determined to be a function of: (1) the maximum number M of legitimate consecutive low digital voltage values or amplitudes that should occur and (2) the attack and decay times. More precisely, the minimum value for K is M+1, since no error can positively be detected for a consecutive sequence of low amplitudes less than M+1. Alternatively, depending on the typical length of attack and decay times, as determined from tapes of various manufacturers, K can be higher than M+1. That is, if the attack and decay times are lengthy so that there is a slow transition into and out of drop-outs, then K can be increased. In the current embodiment of the invention, when data on a magnetic tape is encoded using a run length limited encoding of (0,3) and the "tape marker" consists of a binary "1" followed by five binary "0"s, the value of K has been determined to be 6 which is its minimum value. The tape marker is an indicator that a data record follows the end of the marker.

The magnitude of AVR has been determined to be a function of (1) the noise associated with voltages that should be decoded as binary zeros and (2) relatively low amplitude digital voltages that should be decoded as binary ones. Thus, AVR should be large enough to cause nonacceptance of higher than normal low amplitudes that should be decoded as binary zeros and, at the same time, AVR should be small enough to cause acceptance of lower than normal high amplitudes that should be decoded as binary ones. Typical values of AVR have been found to be in the range 50-60%.

The value of TTR has been determined to be primarily a function of the decoder implementation. For example, in the present invention, a particular Viterbi decoder is utilized. Based on testing and observation associated with the operation of this particular Viterbi decoder, it has been determined that setting TTR to be in the range of 90-97% results in greater decoder efficiency than higher or lower percentages.

It should be emphasized that the advantages acquired by tuning the values of the tracking threshold module parameters requires extensive testing and experimentation. For example, in a typical tuning endeavor, the parameters are initially set to N=4, K=6, AVR=50%, TTR=97% and varied according to experimental results, all but N being easily programmable. In particular, the tracking threshold module parameters have been experimentally tuned with regard to certain types of data storage media and their characteristics. For example, magnetic tapes of specified densities have been analyzed with respect to drop-in and drop-out, drop-out being particularly troublesome. Thus, experiments were performed to determine the values of tracking threshold module parameters for magnetic tapes, with the objective being to arrive at parameter values that will yield accurate efficient decoding regardless of the tape vendor or tape manufacturing process. Thus, the experiments were conducted with the assumption that, in general, 80-90% of the information recorded on a magnetic tape is within a normally expected range of amplitudes, while the other 10-20% is in a low amplitude state corresponding to drop-out, in decay time, or in attack time.

The foregoing discussion of the invention has been presented for purposes of illustration and description. Further, the description is not intended to limit the invention to the form disclosed herein. Consequently, variation and modification commensurate with the above teachings, within the skill and knowledge of the relevant art, are within the scope of the present invention. The embodiment described hereinabove is further intended to explain the best mode presently known of practicing the invention and to enable others skilled in the art to utilize the invention in such, or other embodiments, and with the various modification required by their particular application or uses of the invention. It is intended that the appended claims be construed to include alternative embodiments to the extent permitted by the prior art.

What is claimed is:

1. A method for decoding an encoded analog signal representing binary data into the equivalent binary representation, comprising:
    producing digital inputs from an encoded analog signal, said digital inputs including at least a first digital input;
    determining a tracking threshold value independently of the encoding of the analog signal while said digital inputs are being produced; and
    decoding the binary state of each of said digital inputs including said first digital input using a digital decoder wherein said digital decoder utilizes said tracking threshold value
    wherein said tracking threshold value is determined using said first digital input before said first digital input is decoded using said digital decoder and with said tracking threshold value determination being substantially independent of any output of said digital decoder.

2. A method, as claimed in claim 1, wherein:
    the encoded analog signal includes run length limited encoding.

3. A method, as claimed in claim 1, wherein:
    said step of producing includes filtering noise from the analog signal using common mode rejection.

4. A method, as claimed in claim 1, wherein:
    said step of producing includes sampling the analog signal at intervals to obtain a sequence of digital voltage values.

5. A method, as claimed in claim 4, wherein:
    said step of producing includes prequalifying said sequence of digital voltage values such that a sequence of digital voltage signals is obtained, each of said digital voltage signals corresponding to a single binary bit.

6. A method for decoding an encoded analog signal representing binary data into the equivalent binary representation, comprising:
producing digital inputs from an encoded analog signal, said step of producing including sampling the analog signal at intervals to obtain a sequence of digital voltage values, said step of producing including prequalifying said sequence of digital voltage values such that a sequence of digital voltage signals is obtained, each of said digital voltage signals corresponding to a single binary bit, each of said digital voltage values is obtained by averaging a predetermined number of said digital voltage values;
determining a tracking threshold value independently of the encoding of the analog signal while said digital inputs are being produced; and
decoding the binary state of each of said digital inputs using a digital decoder wherein said digital decoder utilizes said tracking threshold value.

7. A method, as claimed in claim 1, wherein:
said decoding step includes using a Viterbi decoder.

8. A method for decoding an encoded analog signal representing binary data into the equivalent binary representation, comprising:
producing digital inputs from an encoded analog signal;
determining a tracking threshold value independently of the encoding of the analog signal while said digital inputs are being produced, said step of determining including:
accepting a number of values, represented by said digital voltage signals, to be used in determining a reference value;
using said reference value in determining said tracking threshold value; and
adjusting at least a first parameter used in said accepting step so that said accepting step is responsive to changes in the amplitudes of said digital voltage signals; and
decoding the binary state of each of said digital inputs using a digital decoder wherein said digital decoder utitlizes said tracking threshold value.

9. A method, as claimed in claim 8, wherein said step of accepting includes:
inputting one of said digital voltage signals having a voltage amplitude; and
comparing said one digital voltage signal with a predetermined accepting value.

10. A method, as claimed in claim 9, wherein:
said predetermined accepting value is a function of said reference value.

11. A method, as claimed in claim 9, wherein:
said step of comparing includes determining whether said voltage amplitude is less than said accepting value.

12. A method, as claimed in claim 8, wherein:
said reference value is the average of a predetermined number N of the amplitude of those values most recently accepted.

13. A method, as claimed in claim 8, wherein:
said step of determining includes modifying said reference value, said modified reference value corresponding to said first tracking threshold value.

14. A method, as claimed in claim 8, wherein:
said step of adjusting includes determining an updated accepting value wherein said updated accepting value is a function of said reference value.

15. A method, as claimed in claim 8, wherein:
said step of adjusting includes reducing said accepting value in response to an amplitude drop-out of digital voltage signals in order to reduce said tracking threshold value.

16. A method, as claimed in claim 15, wherein:
said step of reducing includes reducing said accepting value whenever no voltage sample of a predetermined number K of most recently inputted digital voltage signals has been accepted.

17. An apparatus for decoding an analog signal representing binary data into the equivalent binary representation, comprising:
first means for producing digital inputs from the analog signal, said digital inputs including at least a first digital input;
second means responsive to said first means for determining a tracking threshold value independently of any analog signal encoding; and
third means responsive to said second means for determining the binary state of each of said digital inputs using a digital decoder wherein said digital decoder utilizes said tracking threshold value and wherein said tracking threshold value is determined using said first digital input before said first digital input is decoded using said digital decoder and in which said second means determines said tracking threshold value substantially independently of any output of said digital decoder.

18. An apparatus, as claimed in claim 17, wherein:
the encoded analog signal includes run length limited encoding.

19. An apparatus for decoding an analog signal representing binary data into the equivalent binary representation, comprising:
first means for producing digital inputs from the analog signal, said first means including full wave rectifier means for reducing noise associated with the analog signal;
second means responsive to said first means for determining a tracking threshold value independently of any analog signal encoding; and
third means responsive to said second means for determining the binary state of each of said digital inputs using a digital decoder wherein said digital decoder utilizes said tracking threshold value.

20. An apparatus, as claimed in claim 17, wherein:
said first means includes analog to digital converter means for converting said analog signal to a sequence of digital voltage values.

21. An apparatus for decoding an analog signal representing binary data into the equivalent binary representation, comprising:
first means for producing digital inputs from the analog signal, said first means including prequalifier means for determining an average of a predetermined number of sequential digital voltage values, each average corresponding to a digital voltage signal;
second means responsive to said first means for determining a tracking threshold value independently of any analog signal encoding; and
third means responsive to said second means for determining the binary state of each of said digital inputs using a digital decoder wherein said digital decoder utilizes said tracking threshold value.

22. An apparatus, as claimed in claim 17, wherein:
said third means includes a Viterbi decoder.

23. An apparatus for decoding an analog signal representing binary data into the equivalent binary representation, comprising:
first means for producing digital inputs from the analog signal;
second means responsive to said first means for determining a tracking threshold value independently of any analog signal encoding, said second means including means for determining said tracking threshold value using a reference value, said reference value being determined using a predetermined number of values obtained using said digital voltage signals; and
third means responsive to said second means for determining the binary state of each of said digital inputs using a digital decoder wherein said digital decoder utilizes said tracking threshold value.

24. An apparatus, as claimed in claim 23, wherein:
said means for determining includes means for accepting values using said digital voltage signals.

25. An apparatus, as claimed in claim 24, wherein:
said means for accepting includes means for comparing an amplitude of each digital voltage signal with an accepting value to determine whether said digital voltage signal should be designated an accepted value and used in determining an updated reference value.

26. An apparatus, as claimed in claim 25, wherein:
said means for comparing uses said amplitude to determine said updated reference value whenever said amplitude is greater than or equal to said predetermined accepting value.

27. An apparatus, as claimed in claim 23, wherein:
said means for determining includes averaging means for averaging a predetermined number N of most recently accepted digital voltage signals to obtain said reference value.

28. An apparatus, as claimed in claim 25, wherein:
said second means includes means for adjusting at least a first parameter used by said means for comparing.

29. An apparatus, as claimed in claim 28, wherein:
said means for adjusting includes means for determining an updated accepting value using said reference value.

30. An apparatus, as claimed in claim 23, wherein:
said second means includes error recovery means for reducing said tracking threshold value.

31. An apparatus, as claimed in claim 30, wherein:
said error recovery means includes means for counting to a predetermined number relating to the number of digital voltage signals received by said second means since a digital voltage signal was accepted for use in determining said reference value.

32. An apparatus, as claimed in claim 30, wherein:
said error recovery means outputs an updated accepting value, said accepted value being a function of said reference value.

33. An apparatus, as claimed in claim 32, wherein:
said error recovery means receives a control signal for controlling a reduction in said accepting value.

* * * * *